United States Patent [19]

Webb

[11] Patent Number: 4,914,494
[45] Date of Patent: Apr. 3, 1990

[54] AVALANCHE PHOTODIODE WITH CENTRAL ZONE IN ACTIVE AND ABSORPTIVE LAYERS

[75] Inventor: Paul P. Webb, Beaconsfield, Canada
[73] Assignee: RCA Inc., Vaudreuil, Canada
[21] Appl. No.: 204,365
[22] Filed: Jun. 9, 1988

[30] Foreign Application Priority Data

Jul. 17, 1987 [CA] Canada .................................. 542375

[51] Int. Cl.⁴ .......................................... H01L 27/14
[52] U.S. Cl. ...................................... 357/30; 357/58; 357/16; 357/56; 357/90
[58] Field of Search ................... 357/58, 30 A, 56, 16, 357/30 E, 90, 13

[56] References Cited

U.S. PATENT DOCUMENTS

| | | | |
|---|---|---|---|
| 4,116,733 | 9/1978 | Olsen | 148/175 |
| 4,142,200 | 2/1979 | Mizushima et al. | 357/30 |
| 4,326,211 | 4/1982 | Smeets | 357/30 A |
| 4,442,444 | 4/1984 | Osaka | 357/13 |
| 4,481,523 | 11/1984 | Osaka | 357/30 |
| 4,586,066 | 4/1986 | McIntyre | 357/30 |
| 4,586,067 | 4/1986 | Webb | 357/30 |
| 4,587,544 | 5/1986 | Webb | 357/30 |
| 4,654,678 | 3/1987 | Lightstone et al. | 357/13 |
| 4,656,494 | 4/1987 | Kobayashi et al. | 357/30 |
| 4,700,209 | 10/1987 | Webb | 357/13 |

FOREIGN PATENT DOCUMENTS

| | | | |
|---|---|---|---|
| 2620951 | 11/1976 | Fed. Rep. of Germany | 357/30 A |
| 2330149 | 5/1977 | France | 357/30 A |
| 57-198667 | 12/1982 | Japan | 357/30 A |
| 58-108778 | 6/1983 | Japan | 357/30 A |
| 58-114470 | 7/1983 | Japan | 357/30 A |

OTHER PUBLICATIONS

G. H. Olsen et al., *Journal of Electronic Materials*, vol. 9, No. 6, 1980, pp. 977–987.
G. H. Olsen, *GaInAsP Alloy Semiconductors*, T. P. Pearsall, Editor John Wiley & Sons (New York 1982) pp. 11–41.
F. Capasso et al., Technical Digest of 1984 Optical Fiber Conference, Jan. 23–25, 1984, New Orleans, La., pp. 88–89.
Patent Abstracts of Japan, vol. 8, No. 53, Mar. 9, 84, Yamazaki–JP 58–206178(A)–"Manufacture of Semiconductor Light Receiving Device".
Patent Abstracts of Japan, vol. 10, No. 11, Jan. 17, 1986, Torikai–JP 60–173880, "Semiconductor Photodetector and Manufacture Thereof".
Patent Abstracts of Japan, vol. 8, No. 285, Dec. 26, 1984, Matsushima–JP 59–151475–"Hetero-Structure Avalanche-Photodiode with Buffer".

*Primary Examiner*—William Mintel
*Attorney, Agent, or Firm*—Raymond A. Eckersley

[57] ABSTRACT

The invention relates to an avalanche photodetector having a charge-multiplication region which is spatially separated from the detector surface. This photodetector includes a light-absorptive region, an active region overlying the absorptive region forming a heterojunction therebetween. The photodetector includes a central zone which has a greater concentration of conductivity modifiers than the remainder of the active region and is located in the active region extending into the absorptive region. A cap region overlies the active region and has the opposite conductivity type. The cap region extends a greater distance in the lateral direction than the central zone. A photodetector having a central zone extending across the heterojunction between the active region and light absorptive region have exhibited response times comparable with those of photodetectors having a quaternary layer located between the active region and the absorptive region. However, the photodetector of the present invention does not require the hard-to-grow quaternary layer.

10 Claims, 3 Drawing Sheets

AVALANCHE PHOTODIODE WITH CENTRAL ZONE IN ACTIVE AND ABSORPTIVE LAYERS

This invention relates to an avalanche photodetector having a reduced electric field at the periphery of the PN junction and fast response time without necessarily incorporating a quaternary layer.

BACKGROUND OF THE INVENTION

Optical communication systems which operate in the wavelength range between about 1100 and 1700 nanometers (nm) are of potentially great importance because the dispersion and losses in an optical fiber are typically very low in this wavelength range. Heterojunction devices incorporating binary III-V alloys and solid solutions of these alloys have been found to be particularly useful for this application because their electronic bandgaps occur in this wavelength range and lattice-matched heterojunctions can be obtained by compositional variation. In particular ternary and quaternary alloys of InGaAsP on an InP substrate have been found to be useful materials for both light emitters and detectors. It should be understood, however, that the quaternary alloys usually prove move difficult to grow due to the balancing of the four elements to provide lattice-matched heterojunctions.

Problems which affect the performance of avalanche photodetectors using these materials include bulk tunneling currents which occur at electric fields above about $1.5 \times 10^5$ V/cm in the ternary and quaternary compound used for the light absorptive region, edge breakdown, and multiplication of surface leakage currents at the junction periphery. The tunneling has been reduced by locating the PN junction with its high electric field in a wide bandgap material separated from the light absorptive region in the narrower bandgap material.

Edge breakdown and surface leakage currents have been reduced by the use of surface contouring of the detector sidewalls. However, the electric field reduction at the surface may be small with the result that the surface leakage current may still undergo multiplication. To reduce the multiplication of surface leakage current and to enhance multiplication in an active region away from the heterojunction formed between the active region and a light absorptive region, I provide in my U.S. Pat. No. 4,700,209 issued Oct. 13, 1987, a photodetector having a light absorptive region, an active region overlying the light absorptive region and a cap region of opposite conductivity type to the other two regions overlying the active region. A silicon implanted central zone is located in the active region of an avalanche photodetector. The central zone has a greater concentration of first type conductivity modifiers than the remainder of the active region. My aforementioned U.S. Pat. No. 4,700,209 specifically teaches that the central zone is located spatially separated from the cap and absorptive regions within the active region. The use of the silicon implanted central zone in this photodetector has resulted in achieving multiplication in the active region with electric fields in the order of 4 to $5 \times 10^5$ V/cm while at the same time maintaining the electric field at the heterojunction below the implanted central zone to between 1.5 to $2 \times 10^5$ V/cm so that no significant tunneling in the absorptive region occurs.

My aforementioned U.S. Pat. No. 4,700,209 further discloses an intermediate quaternary layer between the active region and the absorptive region to avoid slow detector response times. It should be understood that a quaternary layer of InGaAsP is more difficult to grow than the remaining layers since the amounts of the four elements must be balanced in specific proportions to obtain a lattice matched heterojunction with the active region, usually InP, and the absorptive region, usually InGaAs.

It would be desirable to maintain response times compatible with those achieved by using an intermediate quaternary layer between the active region and light absorptive layer but without necessarily having to use the quaternary layer.

SUMMARY OF THE INVENTION

In accordance with one aspect of the present invention there is provided an avalanche photodetector comprising a semiconductor body. The body includes a light absorptive region comprising a light absorptive layer of a first conductivity type and an active region of the first conductivity type overlying the light absorptive region and forming a heterojunction at an interface between the active region and the light absorptive region. The semiconductor body includes a cap region of a second conductivity type overlying the active region forming a PN junction at an interface between the cap region and the active region. A central zone is located spaced below the cap region in the active region and extending through the heterojunction into the light absorptive region. The central zone has a greater concentration of the first type conductivity modifiers than the active region, and has a lateral extent less than that of the cap region. The semiconductor body further includes electric contacts.

The fabrication of a photodetector as described above with a central zone located in the active region extending through the heterojunction into the absorptive region has resulted in a photodetector having response times as low as 250 picoseconds without using a difficult-to-grow intermediate quaternary layer. While the manner in which the central zone extending through the heterojunction to reduce response time is not clearly understood, it is believed that the principle of operation is different from the manner in which an intermediate quaternary layer functions to reduce response time. Thus it is within the realm of the present invention to provide the features of a central zone passing through the heterojunction of an absorptive region including an intermediate quaternary layer. It is envisaged that these two features when combined could result in achieving faster response times.

BRIEF DESCRIPTION OF THE DRAWINGS

For a better understanding of the and objects of the present invention, reference may be had by way of example to the accompanying diagrammatic drawings, in which.

DETAILED DESCRIPTION OF THE PREFERRED EMBODIMENT

In the FIGURES the same numerical identification is used for corresponding elements.

Figure 1:
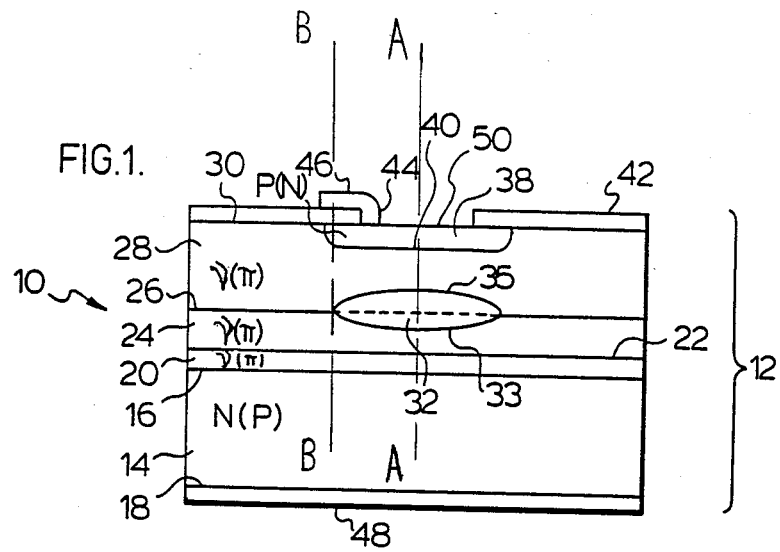
FIGS. 1 and 2 are cross-sectional views of two embodiments of the avalanche photodetector of the invention.
Figure 2:
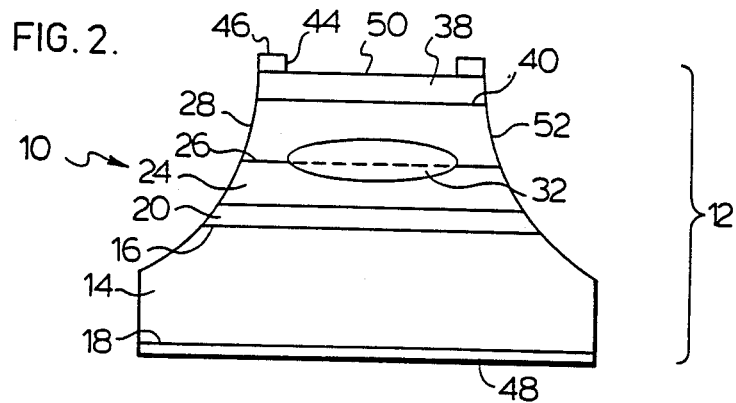

In FIGS. 1 and 2 the photodetector 10 includes a body of semiconductor material 12, a substrate 14 having first and second major surfaces 16 and 18, respectively, and a buffer layer 20 having a surface 22 which overlies the first major surface 16. A light absorptive layer 24 having a surface 26 overlies the surface 22 of the buffer layer 20. The light absorptive layer absorbs light at the wavelength of interest. An active layer 28 overlies the surface 26 of the absorptive layer 24. The active region 28 has a surface 30. A central zone 32 is located in the active region 28 and extends into the absorptive region 24. The central zone 32 has a first interface 33 extending into the absorptive region 24 and a second interface 35 located within the active region 28 spaced a distance from a cap region 38. Cap region 38 extends a distance into the active region 28 from the surface 30. The cap region 38 has a greater lateral extent, in the direction of the plane of the surface 30, than the central zone 32. A PN junction 40 is formed at the interface between the active region 28 and the cap region 38. A passivating layer 42 overlies the surface 30 and has an opening 44 extending therethrough over the cap region 38. A first electrical contact 46 overlies a portion of the surface 30 exposed in the opening 44 to provide electrical contact to the cap region 38 and a second electrical contact 48 overlies the second major surface 18. The first and second electrical contacts 46 and 48, respectively, are a means for providing an electrical contact to the semiconductor body 12. Light incident on the avalanche photodetector 10 typically enters the semiconductor body 12 through the portion 50 of the surface 30 exposed in the opening 44. In FIG. 2, the photodetector has a contoured side wall 52.

The substrate 14 and the buffer, absorptive and active regions 20, 24 and 28, respectively, are of the same conductivity type and the cap region 36 is of the opposite conductivity type. Materials comprising the buffer, absorptive, active and cap regions are preferably chosen such that their lattice constants are matched to that of the substrate to within about 0.2 percent.

The substrate 14 is typically composed of a semiconductor material such an N-type InP doped with sulfur to a concentration of about $5 \times 10^{18}/cm^3$, has sufficient thickness to support the remainder of the structure. The substrate 14 is typically between about 0.03 and 0.04 cm thick initially and has a final thickness between about 0.01 and 0.015 cm before dicing. The major surfaces 16 and 18 are typically treated with Caro's acid or a one percent bromine-in-methanol solution to remove surface contamination and damage prior to the deposition of the layers. The buffer region 20 is typically composed of the same compound, is undoped and is typically between about 4 to 6 micrometers (um) thick. The absorptive region 24 is typically composed of a material which absorbs light at the wavelength of interest in the range between about 1100 and 1700 nm. Suitable materials include $In_{0.53}Ga_{0.47}As$ which absorbs at wavelengths less than about 1650 nm and $In_xGa_{1-x}As_yP_{1-y}$ which absorbs light at wavelengths less than a maximum wavelength determined by the choice of x and y as disclosed, for example, by Olsen et al in The Journal of Electronic Materials 9, 977 (1980). This layer is preferably slightly N-type conducting and is typically deposited as undoped material containing less than about $3 \times 10^{15}$ donors/$cm^3$ and preferably from about 1 to $2 \times 10^{15}$ donors/$cm^3$. The absorptive region 24 is preferably greater than about 2 μm thick and in the order of 6 μm thick to provide complete absorption of the incident light. The active region 28 is typically composed of a semiconductor material such as InP having an excess conductivity modifier concentration less than about $3 \times 10^{15}/cm^3$ and is preferably between about 0.5 and $2 \times 10^{15}/cm^3$. The thickness of active region 28 between PN junction 40 and heterojunction 26 is typically between about 0.5 to 1.5 μm. The central zone 32 typically has N-type conductivity and contains an excess areal concentration of conductivity modifiers above the background concentration. This central zone is typically doped with silicon which is embedded in the active region 28 so that its center of concentration is spaced either adjacent to or apart from the PN junction 40 and extends through the heterojunction 26 into the absorptive region 24. The lateral extent of the central zone 32 is less than that of the cap region 38. The cap region 38 is typically composed of a light transmissive semiconductor material, such as P-type InP, containing an excess of about $10^{18}$ acceptors/$cm^3$ and having a thickness between about 3 and 3.5 μm. The first electrical contact 46 is typically composed of a gold/zinc alloy deposited by vacuum evaporation if the cap region is P-type and is preferably configured so that light enters the detector through that part of the cap region over the central zone 32. The second electrical contact 48 is typically composed of a gold/tin alloy deposited by vacuum evaporation if the substrate 14 has N-type conductivity. The passivating layer 42 is typically composed of material such as $SiO_2$, borophosphosilicate glass or $Si_3N_4$ deposited using evaporation, chemical vapor deposition, or plasma-assisted deposition techniques.

The different regions of the semiconductor body 12 may be sequentially formed on a substrate surface using liquid phase or, preferably, vapor phase epitaxy techniques such as those disclosed by Olsen et al in U.S. Pat. No. 4,116,733, issued Sept. 26, 1978 or by Olsen in GaInAsP Alloy semiconductors, T.P. Pearsall, Editor, John Wiley & Sons (New York 1982), pages 11–41.

Figure 3:
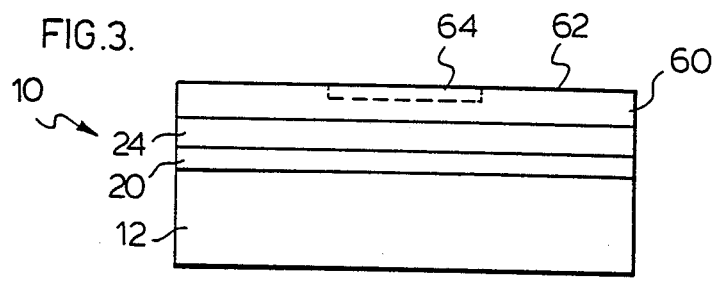
FIGS. 3 and 4 are cross-sectional views of a semiconductor body at different steps in the fabrication of the avalanche photodetector of the invention.
Figure 4:
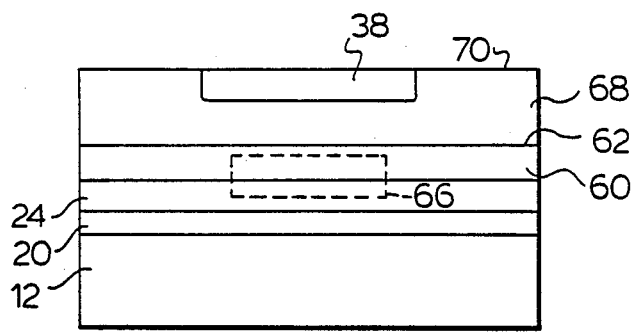

As shown in FIG. 3, the photodiode 10 is formed by sequentially forming the buffer layer 20, the light absorptive layer 24 and a first part 60 of the active layer 28 which is typically between 0.1 and 0.3 μm thick. Conductivity modifiers are then embedded into a surface 62 of the first part 60, preferably by ion implantation, into a central portion 64 thereof to a depth of about 0.1 μm. As shown in FIG. 4, a second part 68 of the active layer 28 is then formed on the surface 62 to a thickness between about 3 and 6 μm. Conductivity modifiers of the opposite type are then embedded, typically by diffusion techniques, into a surface 70 of the second part 68 to form the cap region 38 over the central portion 66. The excess conductivity modifier concentration in the central portion 66 diffuses into the second part 68 and absorptive region 24 during subsequent high temperature processing steps.

To form the photodetector 10 of FIG. 2 the cap region 38 is typically deposited onto the surface 40 of the active region 28 and the contoured sidewalls 52 are then formed using standard photolithographic and etching techniques.

Figure 5:
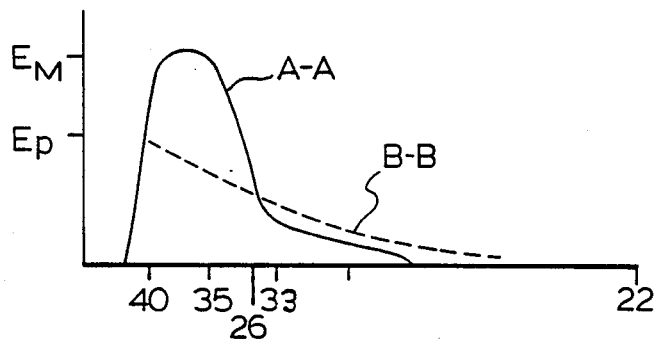
FIG. 5 is a graphical illustration of the electric field distribution along the lines A-A and B—B of FIG. 1.

In the operation of the photodetector of the invention a reverse bias voltage is applied between the electrical contacts. The depletion region along the line A—A of FIG. 1 increases with increasing voltage, with the electric field reaching a value of between about 2 and $4\times10^5$ V/cm when the active region 28 adjacent the PN junction 40 is fully depleted. A further increase in the applied voltage causes the depletion region to extend into the absorptive region 24 where the electric field increases and an electric field $E_M$ sufficient for avalanche breakdown is reached at the PN junction 40. Assuming an abrupt PN junction, the peak electric field $E_M$ along the line A—A of FIG. 1, when the depletion region extends into the absorptive region 24 is:

$$E_M = \epsilon^q(N_A x + N_o + N_t w_c)$$

where q is the electronic charge, $\epsilon$ is the dielectric constant, $N_A$ is the conductivity modifier volume concentration in the active region 28, x is the thickness of the active region between the PN junction 40 and the surface 26 of the absorptive region 24, $N_o$ is the embedded areal conductivity modifier concentration in the central zone 32, $N_t$ is the conductivity modifier volume concentration and $w_c$ is the thickness of the depletion region in the absorptive region 24. $N_o$ is typically between about 1.5 and $3\times10^{12}$/cm² and preferably between 2 and $2.5\times10^{12}$/cm². The first two terms represent the electric field necessary to deplete the active region 28 including the central zone 32. For example, if the electric field for avalanche multiplication is approximately $4.5\times10^5$ V/cm then the field to deplete the active region 28 is preferably between about 2.5 and $3.0\times10^5$ V/cm. This electric field distribution is illustrated as a solid curve, labelled A—A, in FIG. 5 where the numbers on the abscissa correspond to the labels on the surfaces of the photodetector 10 of FIG. 1. The presence of the implanted central region 32 overlapping into the absorbing region 24 causes an increase in the electric field in a narrow region of the absorbing layer immediately adjacent to the heterojunction 26.

The peripheral zone adjacent the central zone 32 will also fully deplete with the application of reverse-bias voltage. However, since the central zone 32 is not present, the maximum electric field ($E_M$) along the lines B—B of FIG. 1 will be less than that along the line A—A and also less than the field required for avalanche multiplication. The peak electric field $E_p$ in the peripheral zone when the depletion region extends into the absorptive region 26 is:

$$E_p = \epsilon^q(N_A x + N_t w_p)$$

where $w_p$ is the thickness of the depletion region in the absorptive region 24 at the periphery. This electric field distribution is illustrated as the broken curve, labelled B—B, in FIG. 5.

Figure 6:
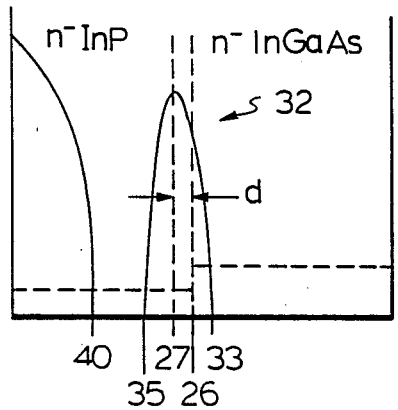
FIG. 6 is the impurity distribution of the photodetectors of FIGS. 1 and 2.

FIG. 6 shows the impurity distribution for the photodetector. From this diagram, it is evident that the implant of silicon forming central zone 32 is diffused across the heterojunction 26 since the lower interface 33 of the central zone 32 is shown extending across the heterojunction 26. A distance "d" is shown in FIG. 6 between the center of the implanted central zone 27 and the heterojunction 26. This distance "d" is preferably within the range 0 to 0.2 $\mu$m. The silicon implant at 27 has a quasi-guassian peak with a standard deviation of approximately 0.2 $\mu$m.

Figure 7A:
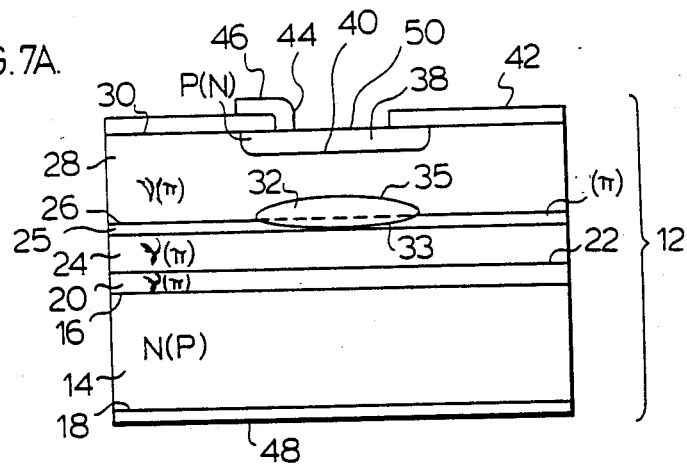
FIGS. 7a and 7b are views similar to FIG. 1 and further including a quaternary layer between the active region and light absorptive region.
Figure 7B:
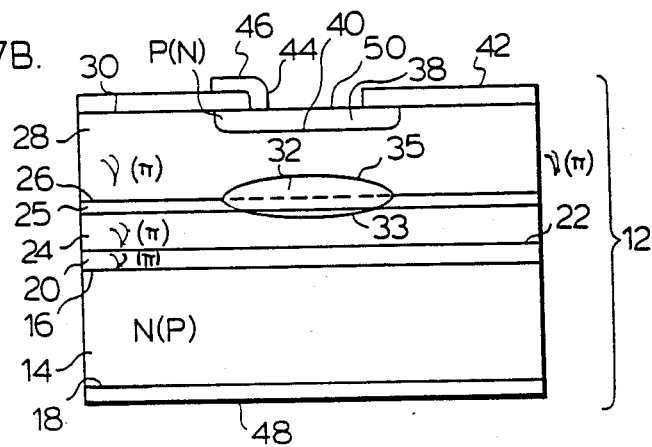

While not fully understood, it is believed that the silicon implant 32 extending from the active region 28 through the heterojunction, and the resulting higher field at the heterojunction, may be responsible for the observed fast response. This is different from the effect of an intermediate quaternary layer 25 (see FIGS. 7a and 7b of InGaAsP sandwiched between the active region 28 and the absorptive layer 24. It is known that the quaternary layer minimizes slow response which occurs due to the discontinuity in the valance band at the heterojunction. The quaternary layer 25 would form part of the overall absorptive region and the central zone 32 would extend through the first heterojunction into the quaternary layer, and for very thin quaternary layers, also into the absorptive layer 24. It is believed that the combination of the central zone 22 and quaternary layer 25 might lead to faster response times. In FIG. 7a the central zone 32 extends through the heterojunction into the quaternary layer 25. In FIG. 7b, the quaternary layer is relatively thin and the central zone 32 extends through the quaternary layer 25 into absorptive layer 24.

What I claim as new and desire to secure by Letters Patent of the United States is:

1. An avalanche photodetector comprising a semiconductor body, said body including:
   a light absorptive region comprising a first light absorptive layer of a first conductivity type;
   an active region of the first conductivity type overlying the light absorptive region and forming a heterojunction at an interface between the active region and the light absorptive region;
   a cap region of a second conductivity type overlying the active region forming a PN junction at an interface between the cap region and the active region;
   a central zone spaced below the cap region having a lateral ex tent less than that of the cap region, the central zone extending from the active region through the heterojunction and into the light absorptive region, and the central zone having a greater concentration of modifiers of the first conductivity type than the active region; and,
   electrical contacts for the semiconductor body.

2. The photodetector of claim 1 wherein the areal concentration of the conductivity modifiers in the central zone is between about 1.5 and $3\times10^{12}$/cm².

3. The photodetector of claim 2 wherein the areal concentration of the conductivity modifiers in the central zone is about 2.0 to $2.5\times10^{12}$/cm².

4. The photodetector of claim 1 wherein the central zone is implanted up to 2 $\mu$m away from the heterojunction and extends through the heterojunction.

5. The photodetector of claim 1 wherein the light absorptive region further includes a quaternary layer of the first conductivity type sandwiched between the light absorptive layer and the active region.

6. The photodetector of claim 5 wherein the central zone extends into the quaternary layer.

7. The photodetector of claim 5 wherein the central zone extends through the quaternary layer into the absorptive layer.

8. The photodetector of claim 1 further including a substrate with the absorptive region overlying a surface of the substrate.

9. The photodetector of claim 8 further comprising a buffer layer overlying-the surface of the substrate and the absorptive region overlying a surface of said buffer layer.

10. The photodetector of claim 8 wherein the substrate is composed of N-type InP, the absorptive layer is composed of N-type material selected from a group consisting of $In_{0.53}Ga_{0.47}As$ and $In_xGa_{1-x}As_yP_{1-y}$ alloys, the active region is composed of N-type InP and the cap is composed of P-type InP.

* * * * *